United States Patent [19]

Carr

[11] Patent Number: 5,293,379
[45] Date of Patent: Mar. 8, 1994

[54] PACKET-BASED DATA COMPRESSION METHOD

[75] Inventor: David W. Carr, Ontario, Canada

[73] Assignee: Gandalf Technologies, Inc., Ontario, Canada

[21] Appl. No.: 68,284

[22] Filed: May 27, 1993

Related U.S. Application Data

[63] Continuation of Ser. No. 689,359, Apr. 22, 1991, abandoned.

[51] Int. Cl.$^5$ .............................................. H04J 3/24
[52] U.S. Cl. .................................... 370/94.1; 370/99; 370/118; 341/65
[58] Field of Search ................... 370/94.1, 94.2, 82, 370/83, 99, 109, 118; 375/122; 341/51, 65, 95; 358/426, 433, 432

[56] References Cited

U.S. PATENT DOCUMENTS

| | | | |
|---|---|---|---|
| 4,464,650 | 8/1984 | Eastman et al. | 340/347 |
| 4,558,302 | 12/1985 | Welch | 340/347 |
| 4,612,532 | 9/1986 | Bacon et al. | 340/347 |
| 4,730,348 | 3/1988 | McCrisken | 370/83 |
| 4,814,746 | 3/1989 | Miller et al. | 341/95 |
| 4,847,619 | 7/1989 | Kato et al. | 341/51 |
| 4,872,009 | 10/1989 | Tsukiyama et al. | 341/51 |
| 4,881,075 | 11/1989 | Weng | 341/51 |
| 4,899,147 | 6/1990 | Schiavo et al. | 370/109 |
| 4,899,148 | 2/1990 | Sato et al. | 341/51 |
| 5,023,610 | 6/1991 | Rubow et al. | 341/51 |
| 5,045,852 | 9/1991 | Mitchell et al. | 341/51 |
| 5,049,881 | 9/1991 | Gibson et al. | 341/95 |
| 5,126,739 | 6/1992 | Whiting et al. | 341/51 |

OTHER PUBLICATIONS

Welch, A Technique For High-Performance Data Compression, Jun. 1984, pp. 8-19 Computer.
Greenfield, Bridge Compression Taps Unused Bandwith, Data Communications, Jul. 1989, pp.54-59.
Miller et al., Variations on a theme by Ziv and Lempel, IBM Research Division, T. J. Watson Research Center, 1988, pp. 13.2.1-13.2.5.

Primary Examiner—Benedict V. Safourek
Assistant Examiner—Chau T. Nguyen
Attorney, Agent, or Firm—Perman & Green

[57] ABSTRACT

A data processing system is described that employs data packets which include at least static and dynamic fields, the static fields containing information that often remains constant during a multi-packet communication interval and the dynamic fields containing information that changes for each packet. Many packets also include a user-data fields. A compression method is described which comprises: reformatting each data packet by associating its static fields with a first packet region and its dynamic fields with a second packet region. The process then assembles a static table that includes static information from at least an initial data packet's first packet region. It then identifies static field information in a subsequent data packet's first packet region that is common to the information in the static table. Such common information is encoded so as to reduce its data length. The common static information is then replaced in the modified data packet with the encoded common static information and the modified data packet is then transmitted. A similar action occurs with respect to user-data information. A single dictionary table is created for all packet headers, while separate dictionary tables are created for each user-data portion of a packet-type experienced in the communication network thereby enabling better compression.

21 Claims, 11 Drawing Sheets

TCP/IP OVER ETHERNET PACKET FORMAT

| 00 | DESTINATION ADDRESS | | | |
|---|---|---|---|---|
| 06 | SOURCE ADDRESS | | | |
| 12 | TYPE = 0x6004 | | | |
| 14 | LAT TYPE | | | |
| 15 | SLOTS | | | |
| 16 | DSTID | DSTSEQ | LAT PACKET | |
| 18 | SRCID | SRCSEQ | | |
| 20 | MSGSEQ | MSGACK | | |
| 22 | DSTSLOT | SRCSLOT | | |
| 24 | LENGTH | MSGTYPE | DATA | PAD |
| 28 | PAD | PAD | PAD | PAD |
| 32 | PAD | PAD | PAD | PAD |
| 36 | PAD | PAD | PAD | PAD |
| 40 | PAD | PAD | PAD | PAD |
| 44 | PAD | PAD | PAD | PAD |
| 48 | PAD | PAD | PAD | PAD |
| 52 | PAD | PAD | PAD | PAD |
| 56 | PAD | PAD | PAD | PAD |
| 60 | FRAME CHECK SEQUENCE | | | |

FIG. 10

| 00 | DESTINATION ADDRESS | | |
|---|---|---|---|
| 06 | SOURCE ADDRESS | | |
| 12 | TYPE = 0x6004 | | |
| 14 | LAT TYPE | | |
| 15 | SLOTS | | |
| 16 | DSTID | DSTSEQ | TRUNCATED LAT PACKET |
| 18 | SRCID | SRCSEQ | |
| 20 | MSGSEQ | MSGACK | |
| 22 | DSTSLOT | SRCSLOT | |
| 24 | LENGTH | MSGTYPE | DATA |

PACKET-BASED DATA COMPRESSION METHOD

This is a continuation of copending application Ser. No. 07/689,359 filed on Apr. 22, 1991, now abandoned.

FIELD OF THE INVENTION

This invention relates to data compression techniques, and more particularly, to a method for transmission of data packets between local area networks, wherein information in the packets is compressed prior to transmission.

BACKGROUND OF THE INVENTION

Data transferred over communication links between commercial computer systems generally contains significant redundancy. A number of mechanisms and procedures exist for lessening the redundancy and for creating substantially more efficient use of the transmission bandwidth. The term "data compression" refers to any process that converts data in a first given format into a second format having fewer bits than the original. Data compression systems are particularly effective if the original data contains substantial redundancy, such as symbols or strings of symbols which repetitively appear with high frequency.

Preferred data compression methods are transparent in that the application computer programmer is not aware of the existence of the compression method, except in system performance manifestations. As a result, decompressed data is an exact replica of the input data and the compression apparatus is given no special program information. So long as the transmission protocols are constant in the communication network, transparent compression can be readily accomplished. However, once various protocols and data formats find their way into a network, effective data compression becomes much more complex.

Such systems can be found today in wide area networks (WAN's), which interconnect pluralities of Local Area Networks (LAN's). In general, internal LAN interconnections occur over wide bandwidth, hard-wired or optical interconnects that alleviate the requirements for data compression. By contrast, most WAN's employ the telephone network for LAN interconnection purposes, and, as a result, are significantly bandwidth-limited.

There are a number of general purpose data compression procedures described in the prior art. A popular compression method, known as "Huffman" encoding translates fixed-size pieces of input data into variable-length symbols. The procedure assigns codes to input symbols such that each code length, in bits, is approximately $\log_2$ (symbol probability), where symbol probability is the relative frequency of occurrence of a given symbol, expressed as a probability. Huffman encoding exhibits a number of limitations. The bit-run size of input symbols is limited by the size of the translation table needed for compression. The decompression process is complex, and it is also necessary to know the frequency distribution for the group of possible input symbols.

A further type of encoding is known as "run-length" encoding and causes sequences of identical characters to be encoded as a count field appended to an identifier of the repeated character. While this approach is effective in graphical images, it has virtually no value in text and has moderate value for data files.

Recently, a method termed "adaptive" compression has appeared and has become, in various configurations, widely used. Algorithms for adaptive compression have been published by J. Ziv and A. Lempel, in "A Universal Algorithm For Sequential Data Compression", IEEE Transactions, Information Theory, Vol. IT-23, No. May 3, 1977, pp. 337-343 and in "Compression of Individual Sequences Via Variable-Rate Coding", IEEE Transactions on Information Theory, Vol. IT-24, No. 5, September, 1978, pp. 5306.

The Lempel-Ziv algorithm converts variable length strings of input symbols into fixed-length (or predictable length) codes. The symbol strings are selected so that all have almost equal probability of occurrence. Consequently, strings of frequently occurring symbols will contain more symbols than a string having infrequent symbols. This form of compression is effective at exploiting character frequency redundancy, character repetitions, and high usage pattern redundancy.

One of the first algorithms published by Lempel-Ziv (typically referenced to as LZ77) maintains a history buffer of the last N characters from the input data stream (typically 4,096) and encodes the output data stream as a sequence of symbols. If the character string is not found in the history buffer, it is encoded as a zero, followed by the unencoded eight bit character, resulting in a nine bit code. "Unencoded" in this sense means the eight bit binary character which corresponds to the alpha-numeric character. If a character or stream of characters is found in the buffer, the stream is encoded as a 1, followed by an index and length in the dictionary. This thereby enables the receiving end to reconstruct, from its copy of the buffer, the transmitted data.

More recently, a modification to a subsequent Lempel-Ziv data compression technique (LZ 78) published by T. Welch, has become known as the LZW algorithm. The LZW algorithm converts strings of varying lengths from an input data stream to fixed-length, or predictable length codes, typically 12 bits in length. The premise of the algorithm is that frequently occurring strings contain more characters than infrequently occurring strings.

Initially an LZW dictionary or code table is empty, except for the first 256 character positions which contain basic alpha-numeric single character entries. A new entry is created whenever a previously unseen string is encountered. The compressor searches the input stream to determine the longest match to a string stored in the dictionary. Each stored string comprises a prefix string and an extension character. Each string has a code signal associated with it. A string is stored in the string table by, at least implicitly, storing the code signal for the string. When a longest match between an input data character stream and a stored stream is determined, the code signal for the longest match is transmitted as the "compressed" code signal and a new string is stored in the string table. The prefix of the new string is the longest match of string characters and the suffix is an extension character which is the next data character from the input data that resulted in the longest match. Thus, as each compression occurs, the string lengths are increased by the addition of the extension character. Additional details of this algorithm can be found in U.S. Pat. No. 4,558,302 to T.A. Welch, and in an article by Welch entitled "A Technique For High-Performance Data Compression" IEEE Computer, June 1984, pp. 8-19.

While the LZW data compression algorithm is widely used, it does exhibit a number of shortcomings. For instance, during early stages in the construction of the dictionary, many data fragments (i.e. character lengths of 2, 3, or 4) will occupy large parts of the available dictionary storage. Thus, the amounts of compression available will be limited by the available strings. Often, in lieu of compressing the data, it will actually expand the data being transmitted. For instance, when only a single character is found to match, as will be the case in the early stages of dictionary construction, the outputting of a 12 bit code for an 8 bit input character will result in a 50% increase in data.

Accordingly, it is an object of this invention to provide a data compression method particularly adapted for use with packetized data.

It is another object of this invention to provide an improved data compression method which avoids the accumulation of short data strings in the compression dictionary.

It is still another object of this invention to provide a data compression method that accommodates a plurality of protocols employing different type packets.

Yet another object of this invention is to provide an altered method of operation for the LZW compression algorithm that enables the attainment of improved compression results.

SUMMARY OF THE INVENTION

A data processing system is described that employs data packets which include at least static and dynamic fields, the static fields containing information that often remains constant during a multi-packet communication interval, and the dynamic fields containing information that may change for each packet. Many packets also include user-data fields. A compression method is described which comprises: reformatting each data packet by associating its static fields with a first packet region and its dynamic fields with a second packet region. The process then assembles a static table that includes static information from at least an initial data packet's first packet region. It then identifies static field information in a subsequent data packet's first packet region that is common to the information in the static table. Such common information is encoded so as to reduce its data length. The common static information is then replaced in the modified data packet with the encoded common static information and the modified data packet is then transmitted. A similar action occurs with respect to user-data information. A single dictionary table is created for all packet headers, while separate dictionary tables are created for each user-data portion of a packet-type experienced in the communication network, thereby enabling better compression.

DETAILED DESCRIPTION OF THE INVENTION

Figure 1:
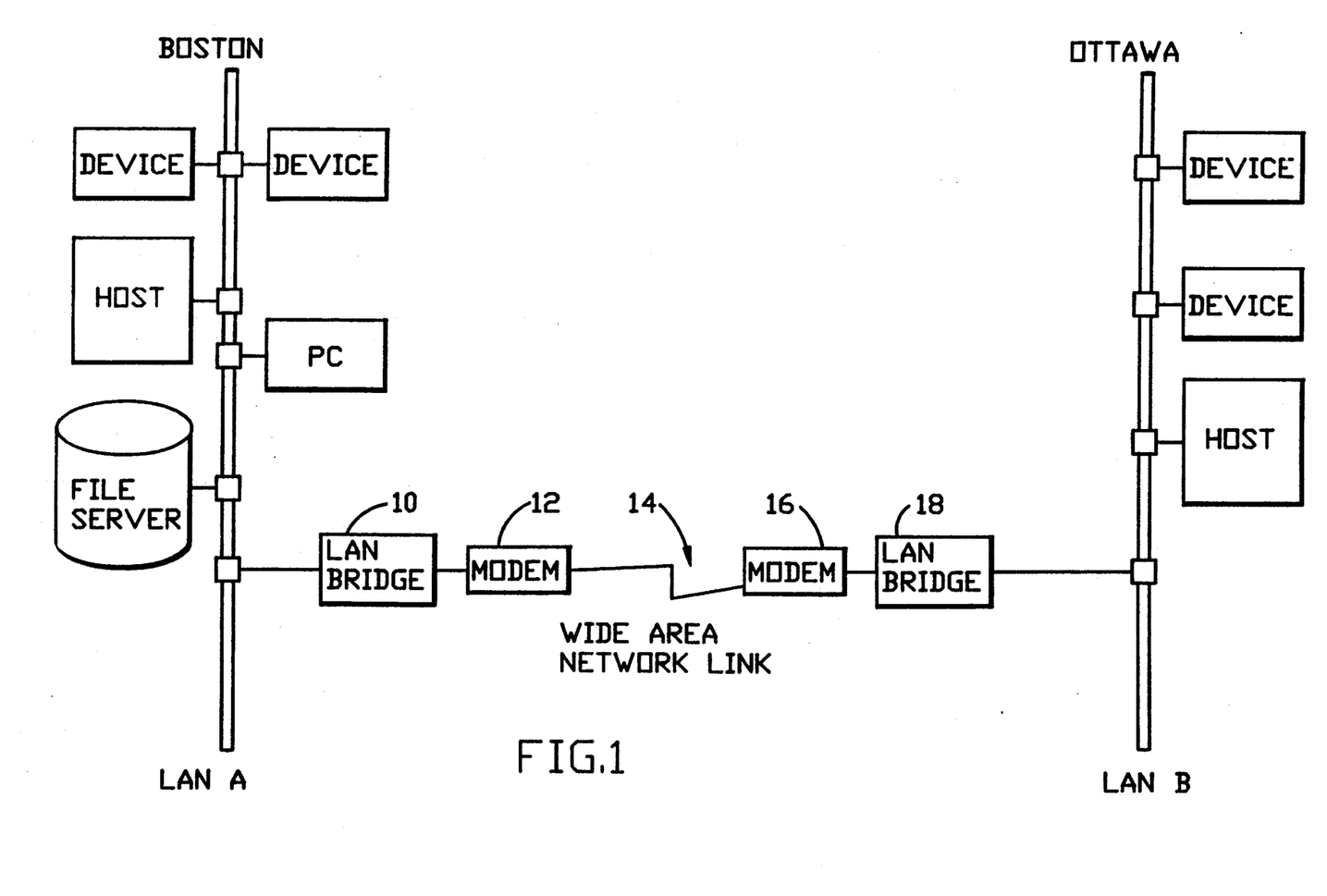
FIG. 1 is a block diagram of a LAN to LAN communication network over a wide area network (WAN) link.

Referring first to FIG. 1, a pair of LAN's A and B are shown, one located in Boston and one in Ottawa. Each LAN has attached thereto, various devices which are well known in the art. As aforestated, there is little or no need for data compression within each of LANs A or B. On the other hand, when data is to be transmitted from LAN A to LAN B, it will first pass through LANBRIDGE 10, where the packet data appearing on LAN A is compressed in accordance with the invention. Such encoded data is then transmitted by modem 12 over WAN link 14 to modem 16. The received data is decompressed by LANBRIDGE 18, and the packet structures appearing at the input to LANBRIDGE 10 are reconstructed and emplaced on LAN B.

Figure 2:
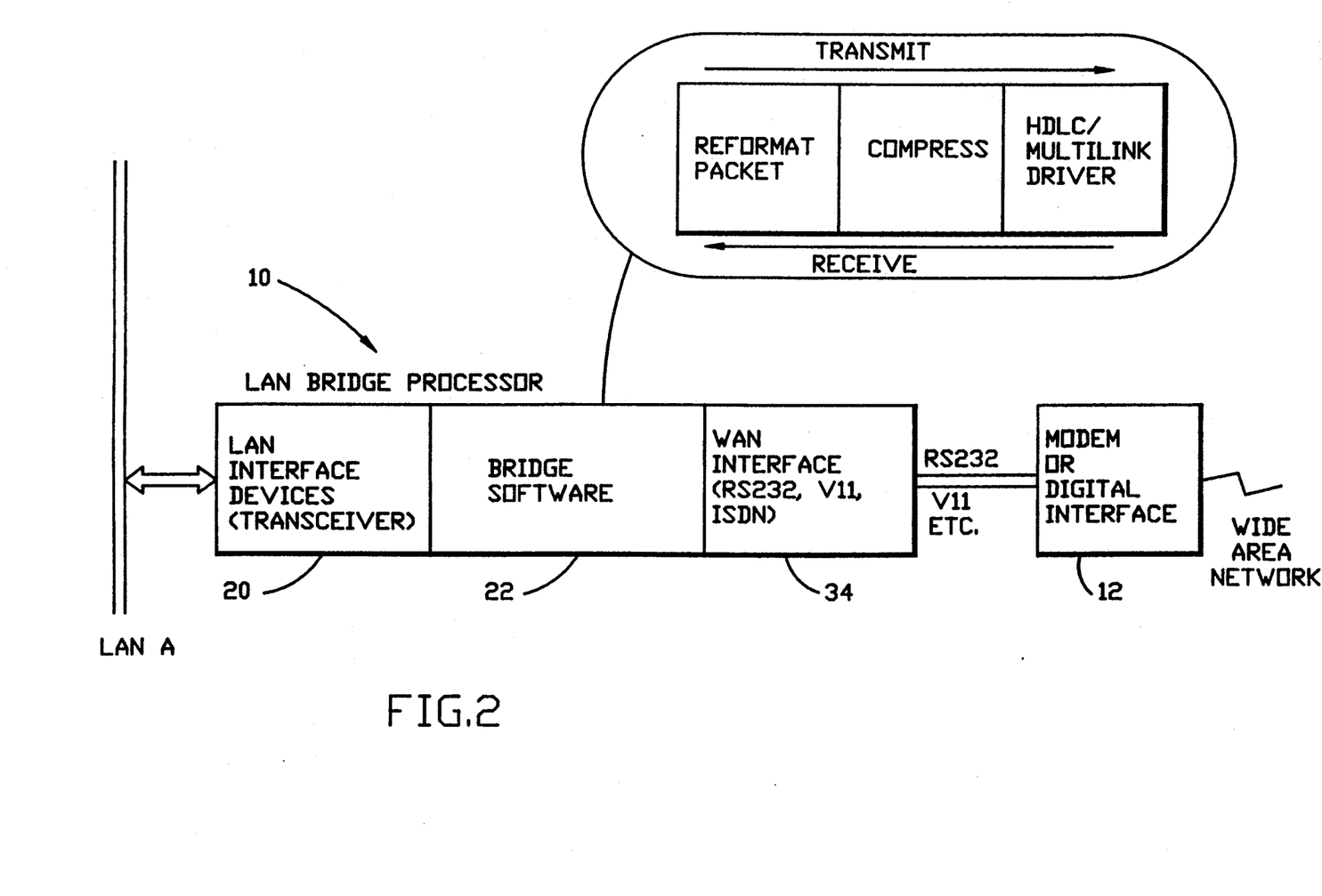
FIG. 2 is a software/hardware block diagram of the LANBRIDGE processor and modem portions of a WAN link.

In FIG. 2, a combined hardware/software block diagram of LANBRIDGE 10 is shown. Data packets appearing on LAN A are received by LAN interface devices 20 and passed into a random access memory (RAM) within LANBRIDGE processor 10. Within LANBRIDGE processor 10 is software 22 which, in addition to performing routing and other functions, also performs reformatting and data compression functions.

Figure 3:
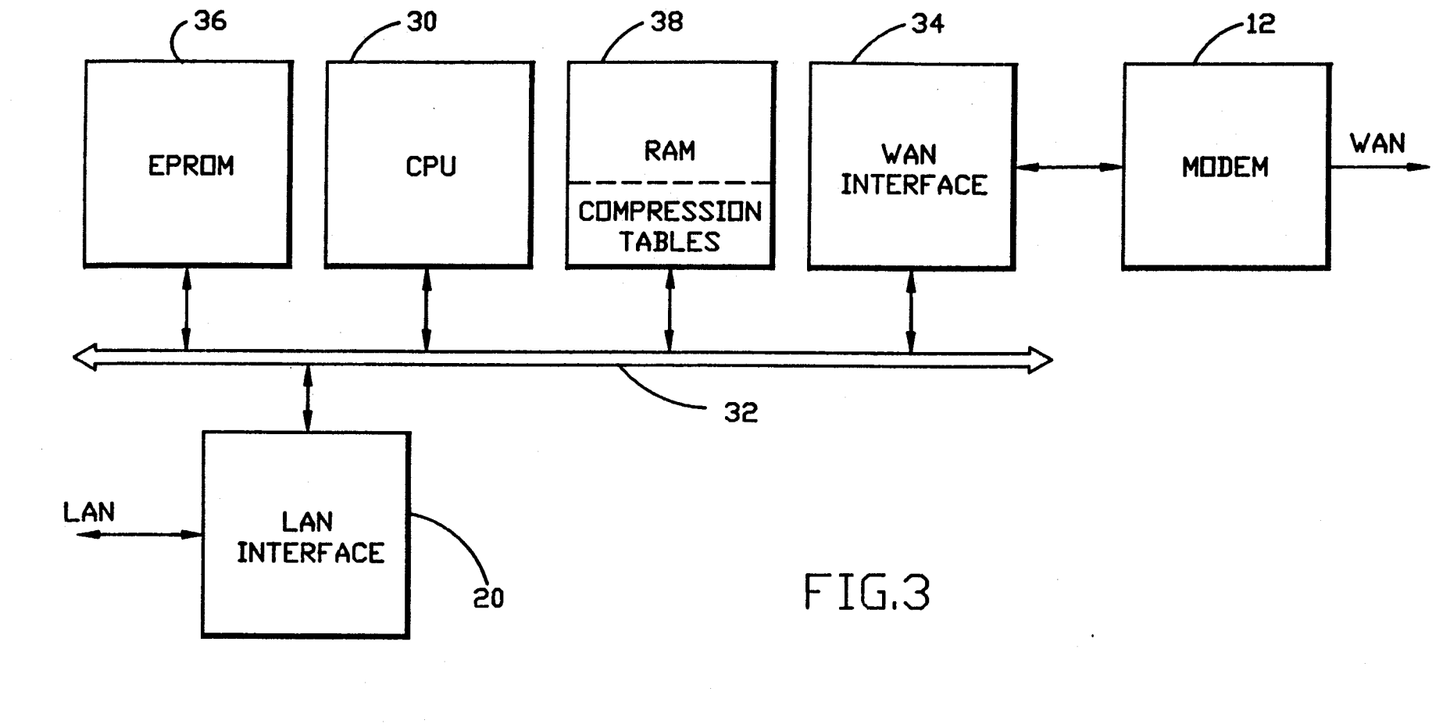
FIG. 3 is a block diagram showing major hardware components of a LANBRIDGE processor.

A high level block diagram of LANBRIDGE processor 10 is shown in FIG. 3. A central processing unit 30 forms the heart of LANBRIDGE processor 10 and communicates with other elements of the system via bus 32. A LAN interface 20 is connected to bus 32, as is WAN interface 34 (provides a gateway for data to and from modem 12). An electrically alterable, programmable read only memory 36 and a RAM 38 provide storage functions for CPU 30. Within RAM 38 are a plurality of compression tables that are employed in the operation of the invention.

Returning to FIG. 2, bridge software 22 within LANBRIDGE processor 10 contains portions which first reformat each packet received from LAN A, and then function to compress data in the reformatted packet in accordance with data stored in the compression tables in RAM 38. The compressed data is then transmitted, through WAN interface 34 and onto the wide area network.

Figure 4:
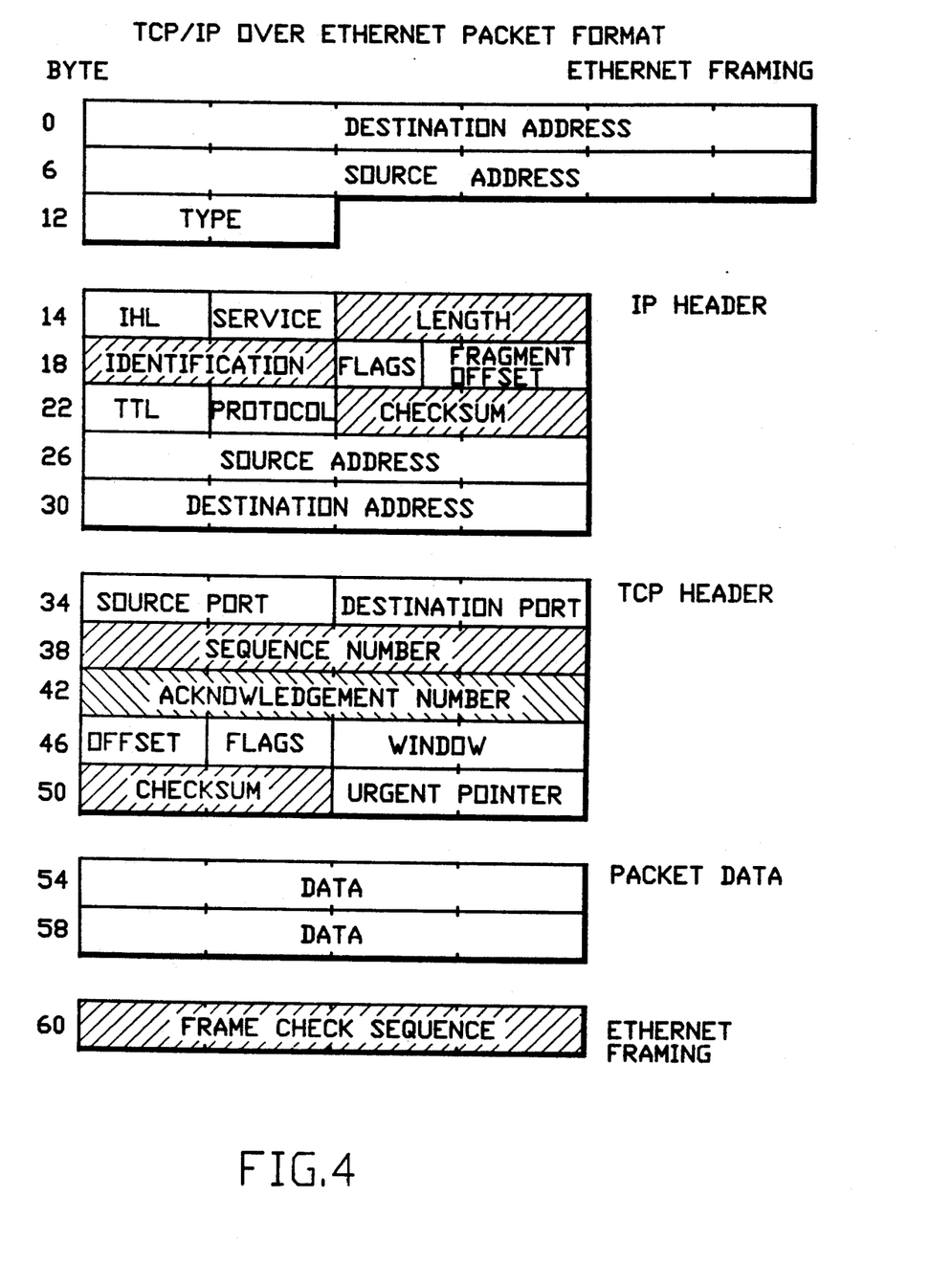
FIG. 4 is a TCP/IP over Ethernet packet format.

For the remainder of this portion of the description, it will be assumed that LANBRIDGE processor 10 has received a TCP/IP packet from LAN A. It will be further assumed that it is employing an Ethernet packet format. Such a format is shown in FIG. 4. In brief, the Transmission Control Protocol/Internet Protocol (TCP/IP) is a well known and widely used protocol. At a high level, it includes four protocols, a network access protocol (NAP), an internet protocol (IP), a transmission control protocol (TCP), and a process application protocol (PAP). Subsidiary to the internet protocol, there can be other protocols besides TCP, for instance, an internet control message protocol (ICMP), a user datagram protocol (UDP), etc. It is to be understood that this invention is equally applicable to other protocols whose packet formats contain the classes of data to be hereinafter described, (i.e. local area transport protocol (LAT)) and it is in no way limited to the TCP/IP format.

In FIG. 4, the fields present in a TCP/IP packet are shown, with the number of bytes in each indicated to the left of the FIG. The information contained within each of the fields is shown within each field's boundary. Certain data within the packet remains constant over a multi-packet communication interval. Such information is hereinafter referred to as "static" information and generally remains unchanged for the duration of a conversation or session. While certain header information is altered during a packet's passage through a network, that information is constant for every packet occurring during a conversation. Such information is contained in the time-to-live (TTL) field, where it is decremented as a packet passes through nodes in a network. However, since a LANBRIDGE is stationary, succeeding packets in a conversation have identical TTL fields.

In FIG. 4, static fields comprise header information including a destination address (6 bytes), source address (6 bytes), and packet type (2 bytes). In addition, within the IP header, the internet header length (IHL), type of service, flags, fragment offset, time to live (TTL), protocol, source address and destination address fields are also static. In the TCP header portion of the packet, static fields comprise the source port designation, destination port designation, data offset, flags, window, and urgent pointer.

As aforestated, all of the above data fields tend to remain unchanged over a plurality of packets. While not shown in FIG. 4, it is understood by those skilled in the art that the TCP/IP packet format will generally be received as portion of a higher level packet format which will include further destination and source addresses as well as control data and protocol identification fields. Each of those can also be considered as static data.

A second group of fields within the TCP/IP packet format are termed "recalculatable". In essence, such fields carry information that can be derived from other fields and they are shown in FIG. 4 crossed hatched from upper right to lower left. They include the length, checksum, and frame check sequence (FCS) fields in the IP header.

There exists a standard for transparent bridges (802.1D) that stipulate the bridge must pass the FCS, end to end, unmodified. The FCS is generated from all data bytes in the packet. On time-sensitive protocols, such as LAT, the extra time required to send all characters in the minimum length packet over low speed links, (e.g., 56 kilobits) may result in the packet being discarded due to a time-out. Thus, network managers may choose to override the 802.1D requirement of passing the FCS end to end. This enables the transmission of a much shorter packets (e.g. elimination of FCS and many PAD bytes in the packet). This invention handles the FCS in a programmable manner. If the network manager selects FCS pass through, then the invention simply appends it as uncompressed data, at the end of a compressed packet. In the alternative, the FCS can be stripped from the packet and regenerated at the remote end by a receiving LANBRIDGE processor. In such a case, the FCS value is discarded.

As regards the length field (number of bytes in the packet), it may be zeroed under certain circumstances, with zeros written-in as placeholders. The length value is regenerated at the receiving end. The checksum value (sum of values in IP header fields) is recalculated by subtracting it from a packet checksum value actually derived from examination of the packet header field values. The result is typically zero which compresses as a static field. At the receiving end, it is restored by the opposite calculation. By performing the subtraction, rather than just zeroing the checksum field, an error in the original checksum is duplicated at the remote end and lanbridge transparency is retained. A non-zero checksum may occur when the packet header has been computed, when an alternate checksum algorithm is experienced, etc. The checksum field in the TCP header is treated similarly.

A third class of data, i.e., "Dynamic", contains fields that can change with every packet. Those fields are shown on FIG. 4, crosshatched from upper left to lower right and include in the IP header, the identification field, and in the TCP header, the sequence number and acknowledgement number fields. With respect to such fields, each is split into two parts, a high order part which is treated as semi-static and a low order part which is treated as dynamic. A dynamic field is one whose data changes with substantially every packet.

The final category of data in a packet is the user data. That data is compressed in accordance with previously known LZW techniques. However, the invention incorporates a number of important modifications, the first being that individual dictionaries corresponding to each protocol type are provided to enable improved compression. A second modification is that data expansion is limited to at most, one bit over the entire length of the user-data portion of the packet.

As regards data expansion, this has occurred often in the prior art when the supposedly compressed data actually comes out as a longer data string than the non-compressed data. The invention assures that, for the header, at most the data expansion is four bits and for the user data, 1 bit. As regards the header, only one twelve bit code is output for the compressed portion thereof. Thus, if only one byte is found in the dictionary, at most 4 additional bits will be transmitted. If more than one byte is found, the invention provides true data compression.

As regards the user-data portion of a packet, if the encoder determines that data expansion will occur (i.e., the "compressed" output exceeds the input data stream length), it aborts the compression action. The user data is outputted as "clear" data and a bit is appended to indicate whether or not the data is encoded. Even if, at the transmitting end the user data is transmitted as clear data, the transmitting ends dictionary has been updated in the course of the encoding action. Thus, at the receiving end, the decoder is required to proceed through the same updating action, even though non-compressed data was transmitted. This assures continued identity of the LZW dictionaries at both ends.

Thus, given the above packet data fields and their essential characteristics, the invention reorders them by segregating them as follows: static; recalculatable; semi-static; and dynamic. The reordered fields occupy the same memory space as the original packet header. The static, recalculatable, and semi-static fields are then compressed using a modified LZW protocol with a dictionary table that is created specifically for the header data. Compression continues into the dynamic fields until the first incompressible field is encountered, at which point the remainder of the dynamic fields are not encoded, but are sent through as unencoded eight bit data. Then, the type field of the LAN packet is used to select a "user-data" LZW dictionary, which dictionary is used to compress the user-data portion of the LAN packet. At the end of the packet, a bit is appended that indicates whether the user data field has been compressed. While it is preferred to use the LZW algorithm, the compression of reformatted packet fields can be done using other string compression algorithms.

Figure 5:
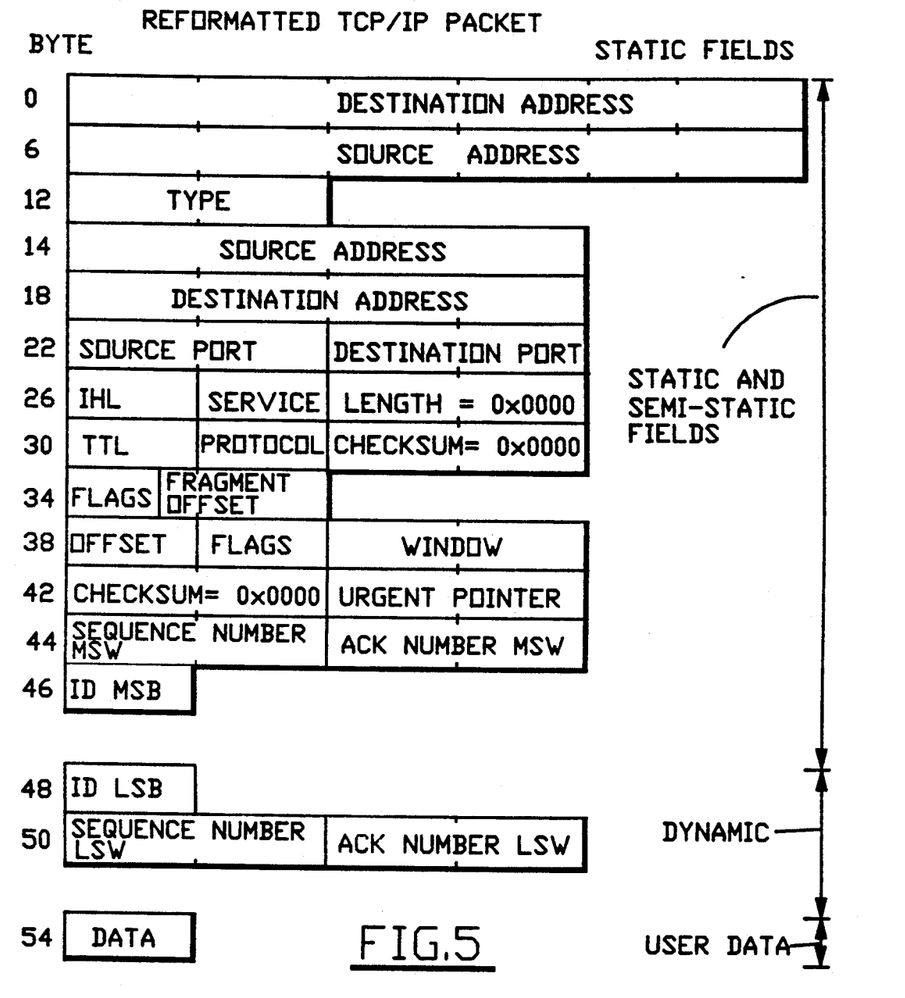
FIG. 5 is the packet format of FIG. 4 which has been reformatted in accordance with the invention.

Turning now to FIG. 5, a reformatted TCP/IP packet is shown wherein the various categories of header fields have been moved within the packet to segregate static, semi-static and dynamic fields; and user data fields. The recalculatable fields have been zeroed, and the sequence and acknowledgement number most significant words (MSW) segregated into the static region of the packet. The identification, sequence, and acknowledgement fields have been segregated into most and least significant portions, with the former being placed in the static region and the latter in the dynamic region.

Figure 6:
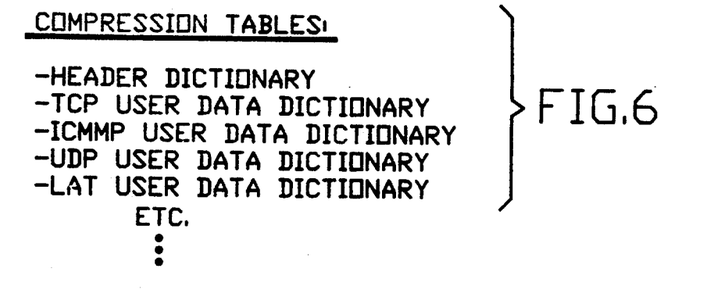
FIG. 6 is a list of compression tables employed to compress the data in the reformatted packet of FIG. 5.

Once the packet is reformatted, as shown in FIG. 5, it is ready to be compressed using an appropriate string compression algorithm. During compression, individual dictionary tables (see FIG. 6) will be employed. One is derived specifically for the header data, while the remaining are for user-data appearing in specific types of protocol packets. For instance, if a TCP protocol is found, a separate TCP user-data dictionary will be created. Likewise, if ICMP, UDP, or LAT protocol packets are detected, they too will have individual user data dictionaries created and will be utilized for succeeding protocol packets of an identical packet type. The segregation of static data into one area of the packet enables substantially improved compression to occur. Furthermore, the use of individual user-data dictionaries for sequences of identical packet types improves the probability that user data appearing in succeeding packets will be efficiently compressed.

Figure 7:
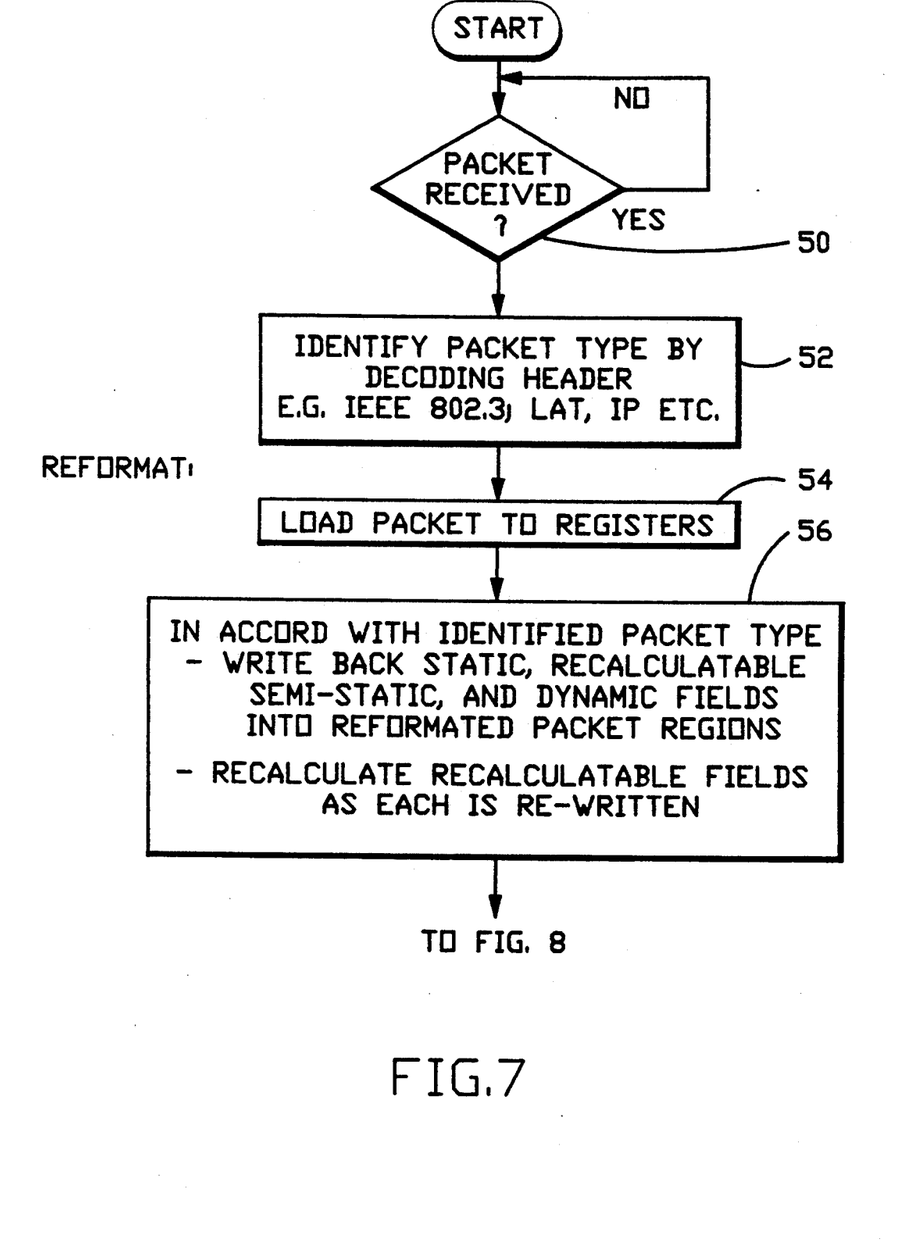
FIGS. 7-9 illustrate a high level block diagram describing the method of the invention.
Figure 8:
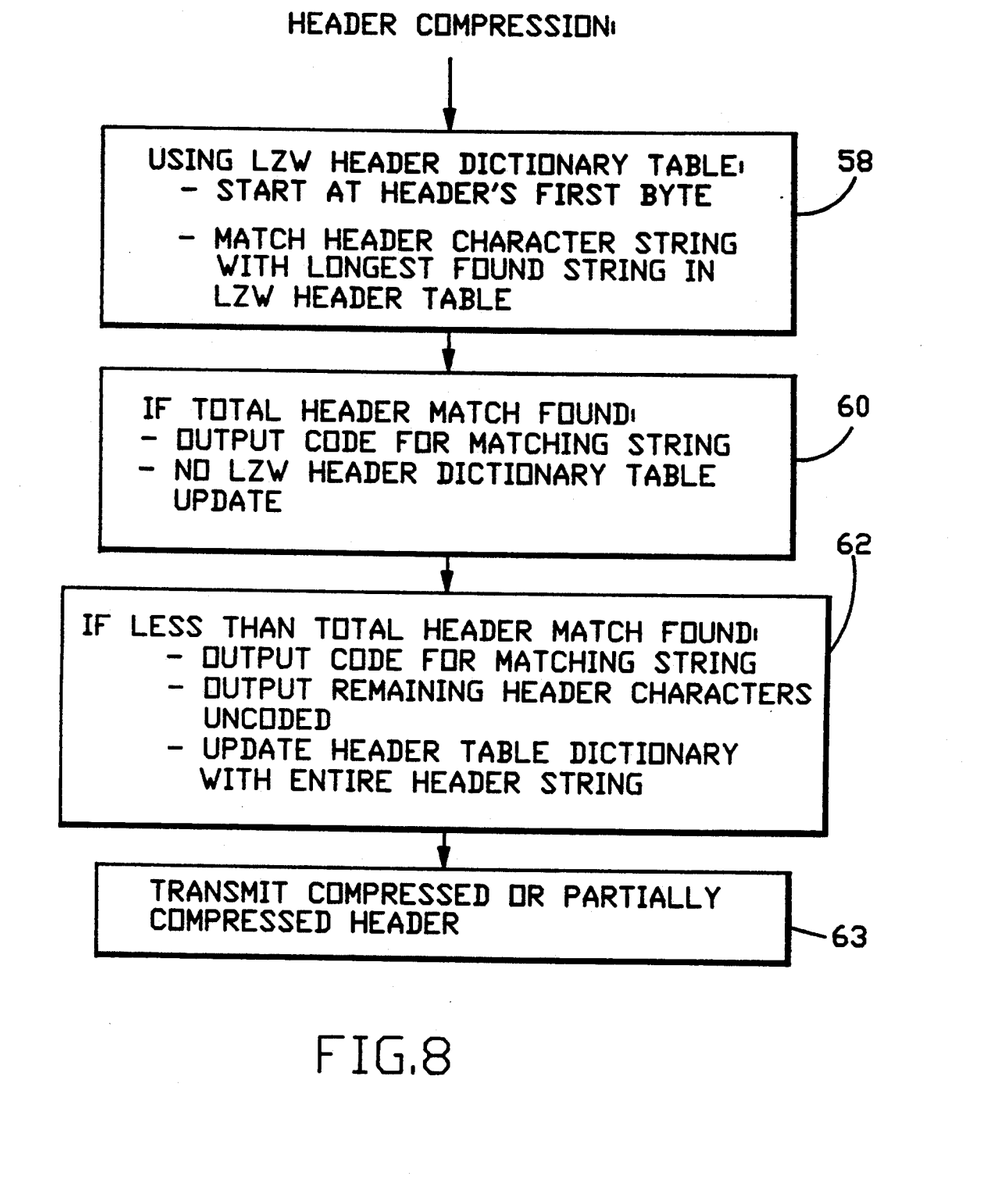
Figure 9:
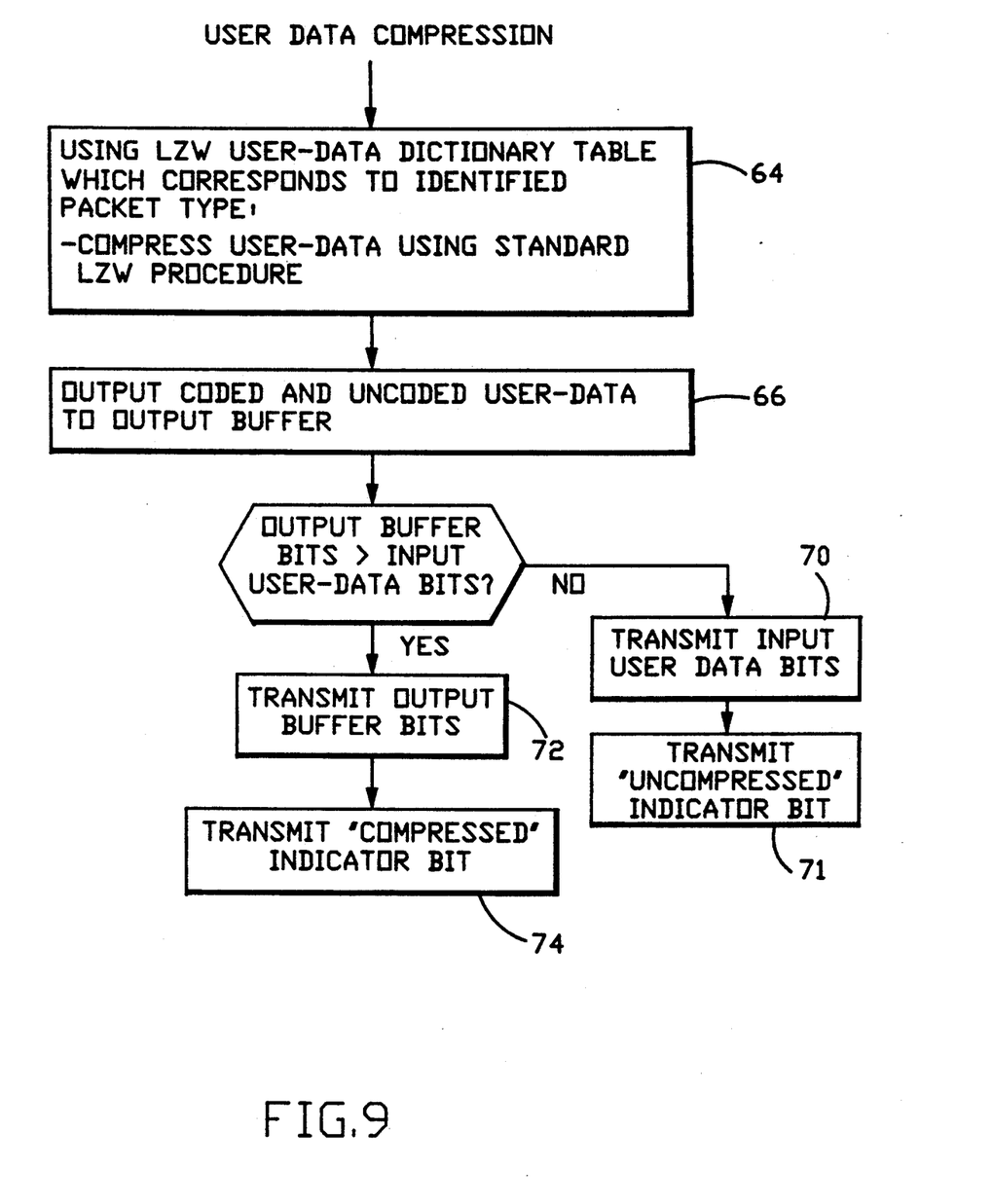

Turning now to FIGS. 7, 8, and 9, a flow diagram is shown which illustrates the algorithm employed within LANBRIDGE processor 10 to accomplish both the reformatting and data compression functions. Initially, LANBRIDGE 10 determines whether a packet has been received (box 50) and if not, it continues waiting. If a packet has been received and placed into storage, the task of identifying the packet's type (box 52) is commenced by examining the packet's type field. In accordance with the type indication found, a subroutine is called which has been designed precisely for the identified type. This subroutine is used to reformat the packet.

The reformatting operation commences by loading the individual fields in the packet into registers within CPU 30 (box 54). Then, in accordance with the identified packet type, a subroutine serially writes back each of the fields, which is designated as static, into the packet. Then, the recalculatable fields are written out of their respective registers, recalculated, and written back into the packet, followed by semi-static and dynamic fields. As aforesaid, each of those fields is written into the packet in a serial fashion so that all static, recalculated and semi-static fields appear first in the packet, followed by the dynamic and user data fields (box 56).

While it is to be understood that the above-described method is the most preferred way for accomplishing the reformatting of the packet data structure, any other data processing technique which accomplishes the same result is acceptable. For instance, such reordering may be accomplished indirectly, and less efficiently, by not physically reformatting the packet, but by inserting pointers in a table to the various static regions in the packet and then accessing them in accordance with the table's notations.

Once the packet is reformatted, header data compression commences (see FIG. 8). For the purposes of this example, it is assumed that an LZW header dictionary table has been established and initialized with an initial character set of 256 entries. The algorithm commences at the header's first reformatted byte (box 58) and matches the characters in the header, character by character, with character strings stored in the header dictionary.

Assuming that a previous packet of the same type has been processed, it is likely that a complete or nearly complete match will occur with a long string in the dictionary table, and the matching characters will then be appropriately encoded using a 12 bit code. Thus, as shown in box 60, if the total header is found to match a string in the header dictionary table, the algorithm outputs a code for the matching characters and there is no LZW dictionary table update required. If less than a total header match is found (box 62), a 12 bit code is outputted for the matching characters, and the remaining non-matched characters are transmitted unencoded (box 63) including the dynamic fields. In other words, no attempt at further compression is made once a non-match is found.

At this point, the algorithm departs from the LZW technique which requires that a new table entry comprising the matching string plus the first character following the matching string be provided to the table. In this instance, the header dictionary table is updated by inserting, as a new entry, the entire static portion of the header (Box 62).

As is known to those skilled in the art, the LAN-BRIDGE at the receiving end of the wide area network will receive the above-noted codes and will proceed to find the matching string within its own duplicate of the header dictionary table. In addition, it too will update its header table with the entire static header string, as did the transmitting end LANBRIDGE, so as to enable efficient decoding of encoded data.

Once header data compression is completed, the user-data portion of the packet is data compressed (see FIG. 9). In this instance, however, a compression dictionary table is utilized which corresponds to the identified packet type (box 64) so as to assure a greater likelihood of string character match. Thus, using the LZW user-data dictionary corresponding to the packet type, the user-data is compressed using the standard LZW procedure. Codes are then outputted for the compressed data, followed by the unencoded data (box 66) and the reformatted packet then loaded to an output buffer.

The packet's user-data bit length in the output buffer is then compared with the un-reformatted packet user-data bit length still in the input buffer (decision box 68). If the original packet length is shorter, the original input user-data bits are transmitted (box 70) followed by an indicator bit that compression has not occurred (box 71). Otherwise, the output buffer user data bits are transmitted (box 72) and a bit is appended indicating whether the user-data field has been compressed (box 74).

Figure 10:
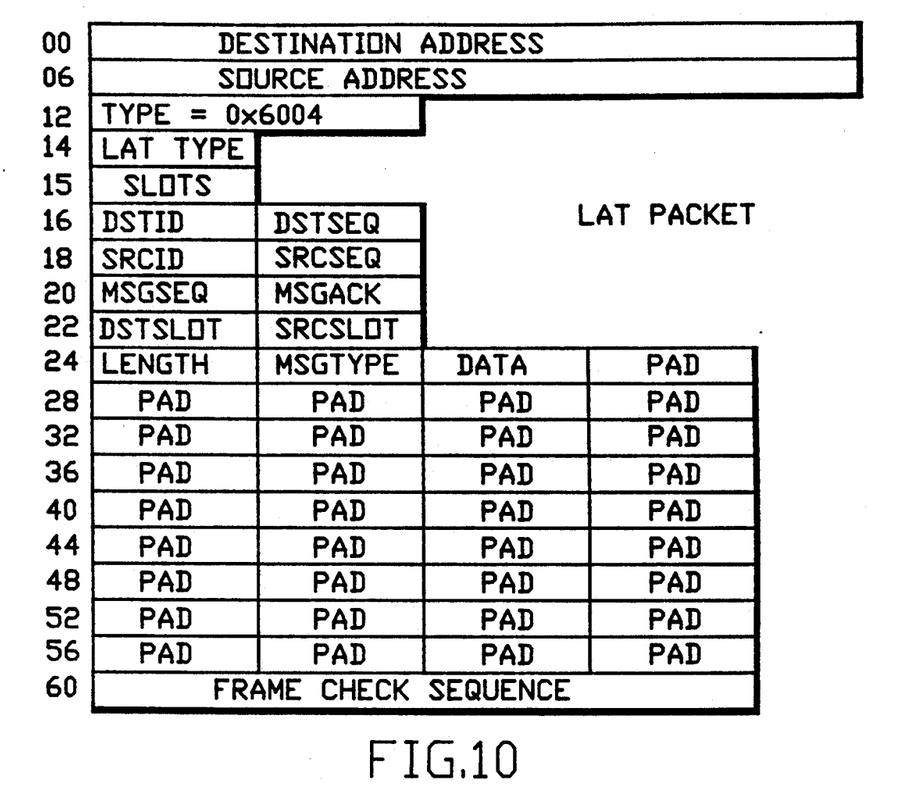
FIG. 10 is a depiction of a LAT packet showing byte numbers plotted along the left side of the packet depiction and the data indicated within the packet bytes.
Figure 11:
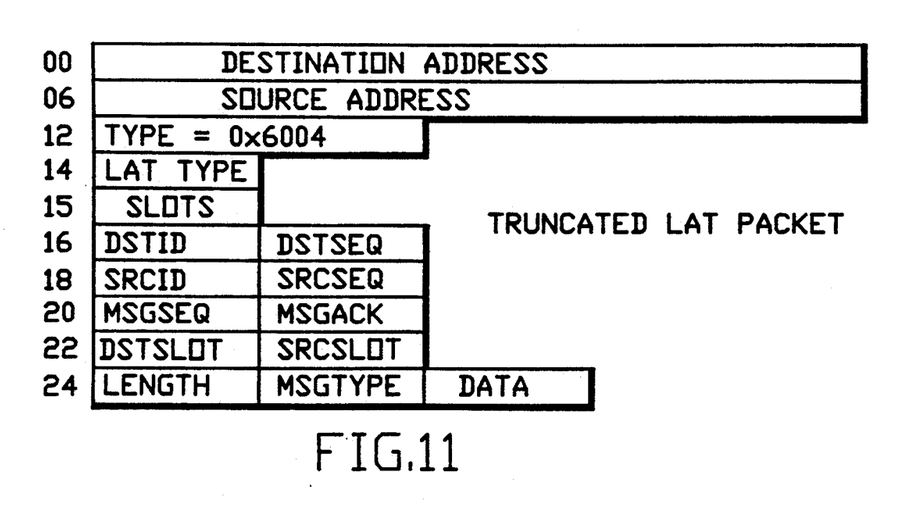
FIG. 11 is the depiction of FIG. 10 after the LAT packet has been truncated.
Figure 12:
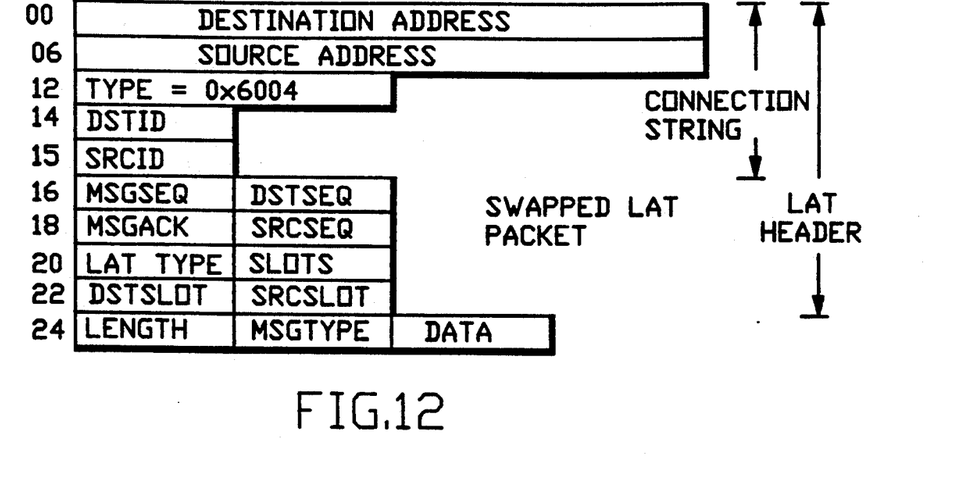
FIG. 12 is a depiction of the truncated LAT packet of FIG. 11 after certain bytes have been "swapped" in their positions within the packet's header structure.

Turning now to FIGS. 10–12, a further embodiment of the invention is shown for achieving additional data compression of dynamic fields. While a LAT packet is employed to explain this portion of the invention, it is to be understood that any packet having fields (e.g., sequence and/or acknowledgement identifiers) which are incremented or decremented as each packet is either received or transmitted also may employ this innovation.

Referring first to FIG. 10, a LAT packet is shown comprising 64 bytes of 8 bit data. The header's first 14 bytes include a destination address, a source address and a type field, and is the same for all Ethernet packets. The "type" field designates a LAT packet in hexidecimal. The next 8 bytes (i.e. "LAT type" through "MsgAck") constitute the remainder of the header.

Following the header are multiple bytes which include additional information regarding the packet and its data. In the packet shown in FIG. 10 only one user data byte is shown, the remaining bytes being taken up by "pad" bytes that are required to meet Ethernet/802.3 requirements for a minimum frame length. The packet ends with a 32 bit frame check sequence (FCS).

The objective of this aspect of the invention is to increase the length of the data string that is likely to be found in the LZW dictionary. This is accomplished by realizing that (1) for packets used in a conversation, there are certain fields which do not change during the conversation and thus are static. Those fields are arranged at the "top" of the packet. (2) There are a number of sequence and acknowledgement fields (e.g. four in a LAT packet) which are incremented by a value of one during succeeding packet receptions/transmissions. By subtraction of the values in these fields between succeeding packets and substitution of the difference values (i.e. either zero or one) in the respective fields of the later packet, additional "delta" data compression is achieved. (3) The entire process is enabled by the creation of a connection table which includes a row, for each conversation, where updated values of the sequence and acknowledgement fields are stored. The operation of this aspect of the invention will be better understood from the following.

Once a LAT packet is identified, it is truncated (see FIG. 11) by eliminating all of the pad bytes and the frame check sequence bytes (assuming FCS pass through is disabled). Then, the remaining header portion is reconfigured, as shown in FIG. 12, so that bytes 0–15 include the following information: destination address, source address, type, destination ID, and source ID. This information does not change during a conversation. The next 4 bytes (16–20) are dynamic and include the following data: message sequence, destination sequence, message acknowledgement and source sequence. These 4 bytes are either incremented by one or remain unchanged from packet to packet.

Figure 13:
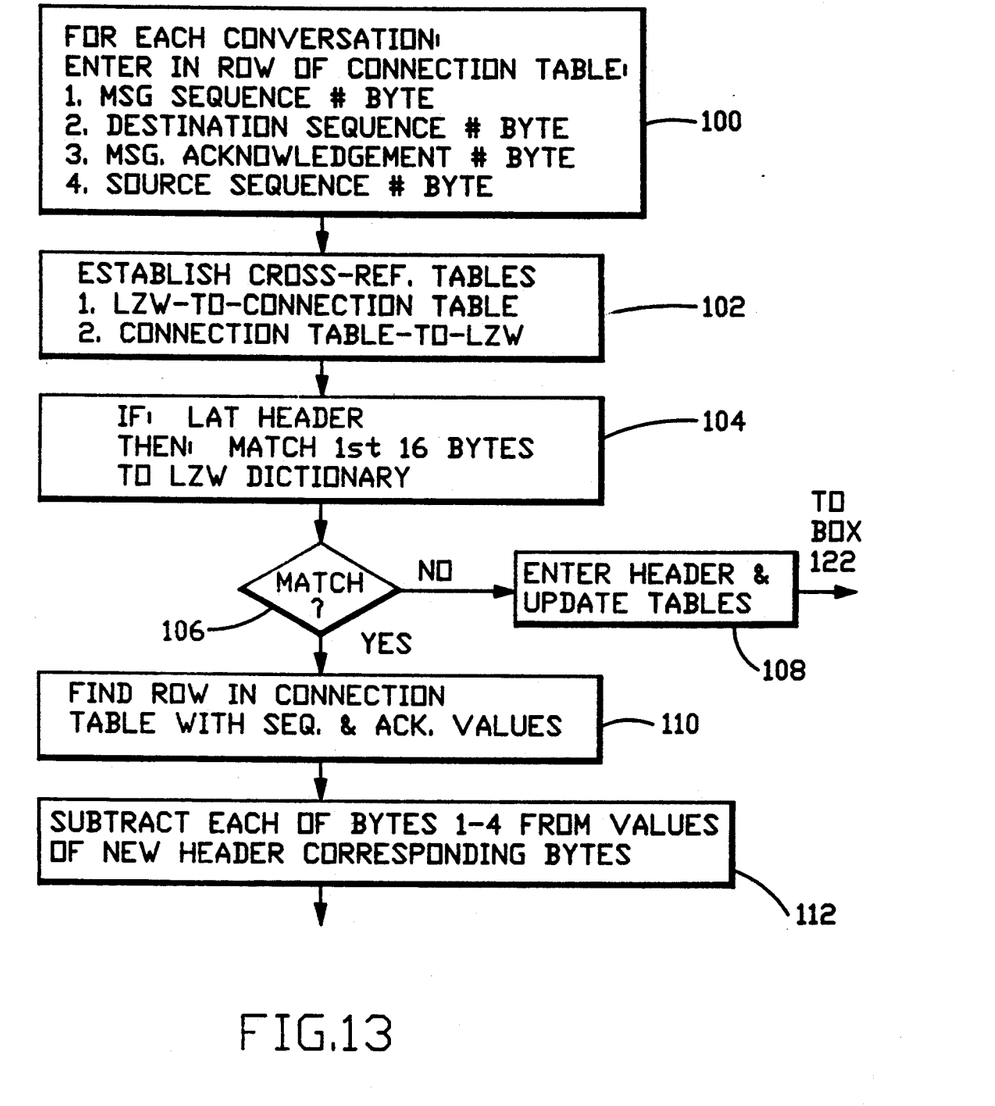
FIGS. 13 and 14 illustrate a high level flow diagram describing a method for data compressing the swapped LAT packet header structure.
Figure 14:
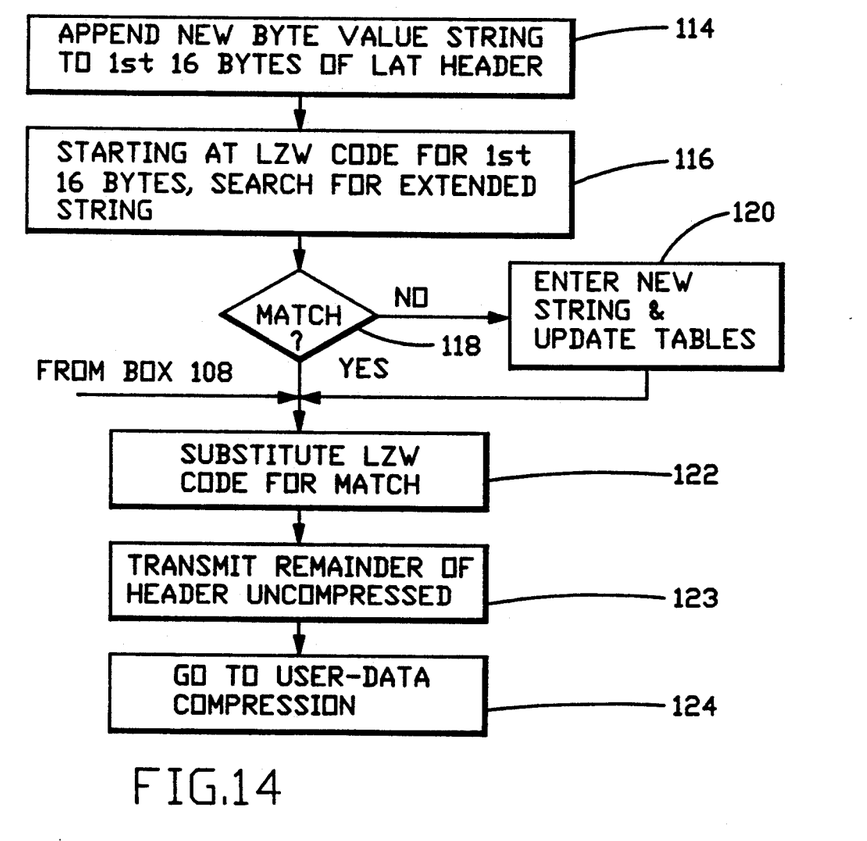

As shown in FIGS. 13 and 14, a connection table is established and is allocated a row for each conversation in progress. For each conversation (see box 100), the allocated row includes the following values from the last packet transmitted or received in the conversation: the message sequence number; destination sequence number; message acknowledgement number; and source sequence number. Additionally, cross reference tables are established (box 102) which provide LZW dictionary-to-connection pointers and connection table-to-LZW dictionary pointers.

Once a conversation is established and a first packet header has been received and entered into the LZW dictionary, that header is assigned an LZW code value. If a new header is determined to be a LAT header, its first 16 bytes are searched in the LZW dictionary (box 104) to determine if there is a match (box 106). If no match is found, indicating that this is a new conversation, the header is entered into the LZW dictionary and the various tables are updated (box 108). If, on the other hand, the conversation is already in progress and a match is found, a cross reference table (using the LZW code value from the dictionary) is accessed to find where in the connection table the sequence and acknowledgement values from the previous packet's header is stored (box 110). Once those values are found, they are subtracted from each of the corresponding values in the new LAT header (box 112), and the remainders are substituted for the same fields in the original packet. In specific, since those fields are generally incremented by 1 or left unchanged in succeeding packets, the resulting remainder byte values, after subtraction, will either be all zeros or will exhibit only a one in the least significant bit position. Since only 4 bytes are being considered (one per field), there will only be the possibility of 16 separate combinations of values in the bytes, after subtraction.

After the new remainder values have been appended to the static header string (box 114), the LZW dictionary is searched to determine if there is a match for the extended string. The search begins at the LZW code assigned to the first 16 bytes and then continues to higher code values. If no match is found (box 118), the new string is entered and the tables are updated (box 120). If, a match is found, the associated LZW code is substituted for the matching extended header string (box 122). At this point, the LZW code and remaining uncompressed header fields (if any) are transmitted (box 123). The procedure then increments to the user data compression procedure previously described (box 124).

Generally, after one packet, there is a high probability of finding a match for the entire header in the dictionary. At most 16 frames in an entire conversation will not compress to the maximum amount, for the reason that they have not been seen before. Compression is thus achieved for both the static header portions and certain dynamic portions that see an increment after each packet is handled.

In summary, by reordering the information in the received packets into static and dynamic regions, longer, compressible character strings result and higher compression ratios are achieved using LZW and similar string compression algorithms. For instance, the header dictionary does not contain the uncompressible dynamic fields, thereby conserving dictionary space for strings which will compress. In addition, by modifying the string compression algorithm to allocate a specific dictionary table to a packet's header portion and immediately updating the header dictionary table to include an entire header character string, the learning time for the compression algorithm is substantially reduced. For instance, using the standard LZW algorithm, learning time for the header will require 20 to 40 packets. With this invention, the learning time encompasses one packet. Finally the use of individual user-data dictionary compression tables, by packet type or connection, enables higher efficiency compression.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

I claim:

1. In a data processing system that employs packets, a packet including at least static fields and dynamic fields, said static fields including data which remains constant over plural packets, said dynamic fields including data which may change for each packet, some said packets also including user-data fields, a method for compressing said packets for transmission from one to another portion of the system, the method comprising:

a. reformatting each packet by associating its static fields with a first packet region, and its dynamic-fields with a second packet region;
   b. assembling a static table that includes static field data from at least an initial data packet's first packet region and assigning a code value thereto;
   c. identifying static field data associated with a subsequent packet's first packet region that is common to data in said static table, and selecting a code value assigned to said data that is common in said static table;
   d. modifying said subsequent packet by replacing said common, static field data with said assigned code value; and
   e. transmitting said modified subsequent packet.

2. The method of claim 1, wherein said reformatting step occurs with respect to data contained within header fields appearing in each packet and the method commences with the step of segregating header fields and user-data fields.

3. The method of claim 2 wherein said reformatting step further comprises rearranging each packet to place its static fields into said first packet region and its dynamic fields into said second packet region.

4. The method of claim 3 wherein said packets comprise semi-static data fields that contain semi-static data, a first portion of which can change with every packet and a second portion of which remains static over a plurality of packets, said method comprising the added step of:

a1. associating said first portion of said semi-static data with said first packet region so that it is compressed along with other static data.

5. The method of claim 4 wherein said method comprises the added step of:

e1. transmitting, uncompressed, said second portion of said semi-static data and data in said dynamic fields.

6. The method as recited in claim 1, comprising the additional steps of:

f. assembling a user-data table that includes data in a user-data field from at least an initial packet and assigning a determined code value thereto;
   g. identifying data in a user-data field in a subsequent packet that is common to data in a user-data field entry in said user-data table and selecting said determined code value assigned to a said entry containing common data; and
   h. modifying said subsequent packet by replacing said common data in said user-data field with said determined code value.

7. The method of claim 6, wherein said data processing system employs a plurality of protocols, each protocol employing a unique packet structure, said method comprising the added step of:

i. establishing for each one of a group of selected protocols, a user-data table, whereby user-data in a packet belonging to a selected protocol is compressed in relation to common user-data in a said user-data table specific for a selected protocol.

8. The method as recited in claim 7 further comprising the step of:

d1. appending a coded symbol to a packet which indicates whether it has been data compressed or not.

9. The method of claim 6, comprising the additional step of:

i. determining if said determined code value, in addition to remaining uncompressed user-data of a packet is greater in bit length than all uncompressed user-data in said packet, and if so, modifying step e by transmitting said uncompressed user-data from said packet in lieu of said determined code value and remaining uncompressed user-data.

10. The method as recited in claim 1, wherein information in a dynamic field of a packet is transmitted without modification.

11. The method as recited in claim 1, wherein static field data in said static table comprises all static field data in a packet, to thereby enable a matching with all data in a static field of a subsequent packet and a transmission of a single code value in lieu of all matching static data.

12. The method as recited in claim 1, wherein a packet includes a recalculatable data field including recalculatable data, the method further comprising the steps of: calculating a value for said recalculatable data field based on data present in said packet;

subtracting said calculated value from a value in said recalculatable data field to derive a difference value;
   inserting said difference value into said recalculatable data field of said packet; and
   at a receiving data processing system that receives said packet containing said difference value, calculating a value of recalculatable data from data in said received packet, and adding said value of recalculatable data to said difference value.

13. The method of claim 1, wherein said data processing system is adapted to make a plurality of connections with other data processing systems, each connection manifesting different information in a packet structure, said method comprising the added step of:

f. establishing for a connection, a connection table specific for said connection, whereby information in a packet belonging to said connection is compressed in relation to common information in said connection table specific for said connection.

14. In a data processing system that employs packets, a packet having a header which includes at least static and dynamic fields, said static fields including data which is constant during a multi-packet communication interval, said dynamic fields including data which may change for each packet, a method for compressing the contents of said packets for transmission from one portion of the system of another portion of the system, the method comprising:

a. reformatting each packet by placing static fields first in order in each said packet;

b. assembling a table in said one portion of said system that includes all header static field data from at least an initial packet's header and associating therewith a code value;

c. identifying header data in a subsequent packet that is common to the static field data in said table and compressing common static field data by selecting a code value associated therewith in said table;

d. if said header of said subsequent packet contains additional static field data not included in said static field data in said table, updating said table to include static field data identical to that contained in said subsequent packet; and e. transmitting said subsequent packet to a receiving processor in said another portion of said system, the header of said subsequent packet including the code value selected in step a, in lieu of said common static field data.

15. A method for compressing packets in a data communication system, each said packet comprising header fields that include at least static data strings and dynamic data strings, a. restructuring each header field to segregate static data strings from dynamic data strings, b. assembling a compression table that includes static data strings from packet headers, and a code value assigned to each static data string;

c. examining a restructured static data string in a header of a new packet to determine if a matching static data string is included in said compression table, and if a match is found, selecting a code value assigned to the matching static data string in said compression table; and d. substituting said code value selected in step c for said restructured static data string in the header of said new packet when said new packet is transmitted in said data communication system.

16. The method of claim 15, further comprising the added steps of:

e. assembling a connection table for conversations over said system, by entering therein selected dynamic data strings from packets in said conversations;

f. for a packet in a conversation, computing differences between dynamic data strings of said packet and selected dynamic data strings from said conversation in said connection table;

g. entering in said compression table, a static data string from said packets in said conversation and computed differences and assigning a code value thereto;

h. for subsequent packets, repeating step f, and updating said connection table each time, with each subsequent packet's selected dynamic data string; and i. for each subsequent packet, searching said compression table to find a match for a said subsequent packet's static data string and said computed differences, and when a match is found, employing a code value, assigned thereto in step g, in lieu thereof, as recited in step (d).

17. The method of claim 16 wherein said selected dynamic data string includes data that is incremented by an integer in succeeding packets during a conversation.

18. The method of claim 15, wherein each said packet header contains a semistatic data field, a first portion thereof including data that changes with every packet and a second portion thereof containing data that remains static over a plurality of packets, said method comprising the added step of:

a1. segregating said second portion of each packet with said data that remains static.

19. The method of claim 15 wherein said data communications system accommodates a plurality of protocols each protocol employing a unique packet structure, wherein said method comprises the added steps of:

e. assembling for each unique packet structure, a user data table and entering therein user-data strings from each said unique packet structure and assigning a code value thereto; and f. determining if a user data string from a subsequent packet structure matches a user data string in said user data table and if a match is found, substituting for said user data string in said subsequent packet structure, a code value that is assigned to the user data string in said user data table that is found to match.

20. The method of claim 19, including the further step of:

g. inhibiting the substitution of step f if said assigned code value and remaining non-matching user data exhibits a data length longer than all user-data in a said packet.

21. The method of claim 15, wherein said packet contains a checksum field, said method including the further step of:

c1. calculating a new checksum for said packet, subtracting said new checksum value from the value in said checksum field to obtain a difference value and replacing the value in said checksum field with said difference value.

* * * * *

UNITED STATES PATENT AND TRADEMARK OFFICE
CERTIFICATE OF CORRECTION

PATENT NO. : 5,293,379
DATED : March 8, 1994
INVENTOR(S) : Carr

It is certified that error appears in the above-identified patent and that said Letters Patent is hereby corrected as shown below:

In Claim 14, column 13, line 1, the word "of" (second occurrence) should read --to--.

In Claim 15, column 13, line 26, after "strings," should be --said method comprising--.

Signed and Sealed this

Twenty-eighth Day of June, 1994

Attest:

BRUCE LEHMAN

Attesting Officer                Commissioner of Patents and Trademarks